United States Patent
Bhuyan et al.

(10) Patent No.: US 11,549,181 B2
(45) Date of Patent: Jan. 10, 2023

(54) METHODS FOR ATOMIC LAYER DEPOSITION OF SICO(N) USING HALOGENATED SILYLAMIDES

(71) Applicant: Applied Materials, Inc., Santa Clara, CA (US)

(72) Inventors: Bhaskar Jyoti Bhuyan, San Jose, CA (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 473 days.

(21) Appl. No.: 16/576,341

(22) Filed: Sep. 19, 2019

(65) Prior Publication Data

US 2020/0010954 A1    Jan. 9, 2020

Related U.S. Application Data

(60) Continuation-in-part of application No. 16/006,010, filed on Jun. 12, 2018, now Pat. No. 11,028,478, and a continuation-in-part of application No. 15/486,838, filed on Apr. 13, 2017, now Pat. No. 10,804,094, said application No. 16/006,010 is a division of
(Continued)

(51) Int. Cl.
*C23C 16/455* (2006.01)
*C23C 16/34* (2006.01)
*C23C 16/36* (2006.01)

(52) U.S. Cl.
CPC ...... *C23C 16/45553* (2013.01); *C23C 16/345* (2013.01); *C23C 16/36* (2013.01); *C23C 16/4554* (2013.01); *C23C 16/45536* (2013.01); *C23C 16/45542* (2013.01)

(58) Field of Classification Search
None
See application file for complete search history.

(56) References Cited

U.S. PATENT DOCUMENTS

| | | |
|---|---|---|
| 5,074,017 A | 12/1991 | Toya et al. |
| 5,186,718 A | 2/1993 | Tepman et al. |

(Continued)

FOREIGN PATENT DOCUMENTS

| | | |
|---|---|---|
| EP | 2669249 B1 | 12/2013 |
| EP | 3553204 A2 | 10/2019 |

(Continued)

OTHER PUBLICATIONS

Final Office Action in U.S. Appl. No. 16/950,096 dated Jan. 27, 2022, 13 pages.

(Continued)

*Primary Examiner* — Joel G Horning
(74) *Attorney, Agent, or Firm* — Servilla Whitney LLC

(57) ABSTRACT

Methods for the formation of films comprising Si, C, O and N are provided. Certain methods involve sequential exposures of a hydroxide terminated substrate surface to a silicon precursor and an alcohol-amine to form a film with hydroxide terminations. Certain methods involved sequential exposures of hydroxide terminated substrate surface to a silicon precursor and a diamine to form a film with an amine terminated surface, followed by sequential exposures to a silicon precursor and a diol to form a film with a hydroxide terminated surface.

10 Claims, 5 Drawing Sheets

Related U.S. Application Data application No. 14/533,496, filed on Nov. 5, 2014, now Pat. No. 10,023,958.

(60) Provisional application No. 62/441,293, filed on Dec. 31, 2016, provisional application No. 62/332,867, filed on May 6, 2016, provisional application No. 61/907,717, filed on Nov. 22, 2013.

(56) References Cited

U.S. PATENT DOCUMENTS

| | | | |
|---|---|---|---|
| 5,580,388 | A | 12/1996 | Moore |
| 6,634,314 | B2 | 10/2003 | Hwang et al. |
| 6,818,250 | B2 | 11/2004 | George et al. |
| 7,244,683 | B2 | 7/2007 | Chung et al. |
| 7,897,208 | B2 | 3/2011 | Mahajani et al. |
| 8,329,599 | B2 | 12/2012 | Fukazawa et al. |
| 8,562,746 | B2 | 10/2013 | Gurary et al. |
| 9,637,822 | B2 | 5/2017 | Bergmann et al. |
| 10,023,958 | B2 | 7/2018 | Nguyen et al. |
| 10,134,617 | B2 | 11/2018 | Gurary et al. |
| 2004/0004859 | A1 | 1/2004 | Forbes et al. |
| 2005/0025885 | A1 | 2/2005 | McSwiney et al. |
| 2005/0163927 | A1 | 7/2005 | McSwiney et al. |
| 2006/0102081 | A1 | 5/2006 | Ueno et al. |
| 2007/0218702 | A1 | 9/2007 | Shimizu et al. |
| 2008/0160174 | A1 | 7/2008 | Wang et al. |
| 2009/0137132 | A1 | 5/2009 | Bhatia et al. |
| 2010/0068894 | A1 | 3/2010 | Wang et al. |
| 2010/0124618 | A1 | 5/2010 | Kobayashi et al. |
| 2010/0304047 | A1 | 12/2010 | Yang et al. |
| 2012/0009802 | A1* | 1/2012 | LaVoie ............. C23C 16/45529 118/704 |
| 2012/0214318 | A1* | 8/2012 | Fukazawa ........... H01L 21/0228 257/E21.24 |
| 2013/0071580 | A1 | 3/2013 | Weidman |
| 2013/0078376 | A1 | 3/2013 | Higashino et al. |
| 2013/0118407 | A1 | 5/2013 | Park et al. |
| 2013/0244446 | A1 | 9/2013 | Tsuji et al. |
| 2014/0273528 | A1 | 9/2014 | Niskanen et al. |
| 2014/0356549 | A1 | 12/2014 | Varadarajan |
| 2015/0147484 | A1 | 5/2015 | Nguyen et al. |
| 2015/0376211 | A1 | 12/2015 | Girard et al. |
| 2015/0376786 | A1 | 12/2015 | Yudovsky et al. |
| 2016/0111272 | A1 | 4/2016 | Girard et al. |
| 2016/0281227 | A1 | 9/2016 | Kobayashi et al. |
| 2017/0140924 | A1 | 5/2017 | Suzuki et al. |
| 2017/0140925 | A1 | 5/2017 | Suzuki et al. |
| 2018/0096842 | A1 | 4/2018 | Varadarajan et al. |
| 2018/0138405 | A1 | 5/2018 | McKerrow et al. |
| 2018/0197733 | A1 | 7/2018 | Suzuki et al. |
| 2018/0269058 | A1 | 9/2018 | Smith et al. |
| 2018/0269061 | A1 | 9/2018 | Arghavani et al. |
| 2018/0291505 | A1 | 10/2018 | Nguyen et al. |
| 2018/0294152 | A1 | 10/2018 | Xiao et al. |
| 2018/0315597 | A1 | 11/2018 | Varadarajan et al. |
| 2018/0315598 | A1 | 11/2018 | Li et al. |
| 2018/0350587 | A1 | 12/2018 | Jia et al. |
| 2018/0371612 | A1 | 12/2018 | Yoo et al. |
| 2019/0057858 | A1 | 2/2019 | Hausmann et al. |
| 2019/0074172 | A1 | 3/2019 | Susa et al. |
| 2019/0080903 | A1 | 3/2019 | Abel et al. |
| 2019/0085451 | A1 | 3/2019 | Lei et al. |
| 2019/0085452 | A1 | 3/2019 | Lei et al. |
| 2019/0088474 | A1 | 3/2019 | MacDonald et al. |
| 2019/0090358 | A1 | 3/2019 | Aresta et al. |
| 2019/0157078 | A1 | 5/2019 | Van Schravendijk et al. |
| 2019/0163056 | A1 | 5/2019 | Maes et al. |
| 2020/0010954 | A1 | 1/2020 | Bhuyan et al. |
| 2020/0248309 | A1 | 8/2020 | Wang et al. |
| 2020/0273697 | A1 | 8/2020 | Suzuki et al. |
| 2021/0062341 | A1 | 3/2021 | Bhuyan et al. |

FOREIGN PATENT DOCUMENTS

| | | |
|---|---|---|
| TW | 201327679 A1 | 7/2013 |
| WO | 2009055340 A1 | 4/2009 |
| WO | 2009149167 A2 | 12/2009 |
| WO | 2018132568 A1 | 7/2018 |
| WO | 2021050368 A1 | 3/2021 |

OTHER PUBLICATIONS

Johnson, Andrew L., et al., "Recent developments in molecular precursors for atomic layer deposition", Organomet. Chem., 2019, 42, 1-53.

Uznanski, Pawel, et al., "Surface modification of silicon oxycarbide films produced by remote hydrogen microwave plasma chemical vapour deposition from tetramethyldisiloxane precursor", Surface & Coatings Technology 350 (2018) 686-698.

Walkiewicz-Pietrzykowska, Agnieszka, et al., "Type of precursor and synthesis of silicon oxycarbide (SiOxCyH) thin films with a surfatron microwave oxygen/argon plasma", J. Vac. Sci. Technol. A 24(4), Jul./Aug. 2006, pp. 988-994.

PCT International Search Report and Written Opinion in PCT/US2014/065421 dated Mar. 18, 2015, 11 pages.

Du, Y., et al., "Mechanism of Pyridine-Catalyzed SiO2 Atomic Layer Deposition Studied by Fourier Transform Infrared Spectroscopy", J. Phys. Chem. C vol. 111, 2007, 219-226.

Du, Y., et al., "SiO2 film growth at low temperatures by catalyzed atomic layer deposition in a viscous flow reactor", Thin Solid Films vol. 491, 2005, 43-53.

Kim, Hyeong Joon, et al., "Characterization of low-dielectric-constant SiOC thin films deposited by PECVD for interlayer dielectrics of multilevel interconnection", Surface and Coatings Technology vol. 171, 2003, 39-45.

Non-Final Office Action in U.S. Appl. No. 16/950,096 dated Apr. 5, 2022, 11 pages.

"Non-Final Office Action in U.S. Appl. No. 16/550,486, dated May 27, 2021, 7 pages".

"PCT International Search Report and Written Opinion in PCT/US2020/051509 dated Dec. 10, 2020, 9 pages".

Ahn, Dongjoon, et al., "Thermodynamic measurements pertaining to the hysteretic intercalation of lithium in polymer-derived silicon oxycarbide" Journal of Power Sources 195 (2010) 3900-3906.

Closser, Richard G., et al., "Molecular Layer Deposition of a Highly Stable Silicon Oxycarbide Thin Film Using an Organic Chlorosilane and Water". ACS Appl. Mater. Interfaces 2018, 10, 24266-24274.

Lee, Jaemin, et al., "Characteristics of low-k SiOC films deposited via atomic layer deposition". Thin Solid Films 645 (2018) 334-339.

Kim, Hyunjun, "Characteristics of Silicon Oxycarbide Thin Films Deposited By Atomic Layer Deposition for Low-K Gate Spacer". Graduate School of Hanyang University, Thesis for the Master of Science, Feb. 2019, pp. 1-48.

* cited by examiner

METHODS FOR ATOMIC LAYER DEPOSITION OF SICO(N) USING HALOGENATED SILYLAMIDES

CROSS-REFERENCE TO RELATED APPLICATIONS

This application is a continuation-in-part of U.S. patent application Ser. No. 16/006,010, filed Jun. 12, 2018, which is a divisional of U.S. patent application Ser. No. 14/533, 496, filed Nov. 5, 2014, now U.S. Pat. No. 10,023,958, which claims priority to U.S. Provisional Application No. 61/907,717, filed Nov. 22, 2013; and this application is a continuation-in-part of U.S. patent application Ser. No. 15/486,838, filed Apr. 13, 2017, which claims priority to U.S. Provisional Application No. 62/332,867, filed May 6, 2016 and U.S. Provisional Application No. 62/441,293, filed Dec. 31, 2016, the entire disclosures of which are hereby incorporated by reference herein.

TECHNICAL FIELD

The present disclosure relates generally to methods of depositing thin films. In particular, the disclosure relates to atomic layer deposition processes for the deposition films comprising silicon, carbon, oxygen, and, optionally, nitrogen.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

Low-k Si-based dielectric films are very important for the microelectronics manufacturing. One important application for low-k films is as a spacer with low wet etch rate (WER)—as close to 0 Å/min in 1:100 HF as possible—and a dielectric constant (k) value of ~4. The spacer should also maintain a low etch rate after being exposed to a moderate $O_2$ plasma (~2K W remote plasma). Historically, Si-based low-k films have been deposited by ALD in a furnace chamber. To achieve the acceptable film properties, the film needs to be deposited at temperatures >500° C. in the furnace chamber. As thermal budgets continually decrease with every chip node, there is need for the deposition of low-k films at temperatures below 500° C.

Additionally, depositing SiCO films by ALD using typical oxidation sources such as $H_2O$ or $O_2$ results in the majority of the carbon being oxidized, leading to a film with low C content. A carbon level targets of >10 atomic % should decrease etch rates and also help decrease the dielectric constant of the film.

Therefore, there is a need in the art for ALD chemistries and improved methods for SiCO(N) deposition.

SUMMARY

One or more embodiments of the disclosure are directed to methods of depositing a film comprising Si, C, O and N, the method comprising: exposing a substrate surface to a silicon precursor to form a film with silicon-halogen terminations, wherein the silicon precursor comprises a halogenated silyl amide; and exposing the film with silicon-halogen terminations to an alcohol-amine to form a film comprising —OH terminations.

Additional embodiments of the disclosure are directed to methods of depositing a film comprising Si, C, O and N, the method comprising: exposing a substrate surface comprising —OH terminations to first process cycle comprising sequential exposure to a first silicon precursor and a diamine compound to form a film with amine terminations, wherein the first silicon precursor comprises a halogenated silyl amide; and exposing the film with amine terminations to a second process cycle comprising sequential exposure to a second silicon precursor and a diol form a film comprising —OH terminations, the second silicon precursor comprising a halogenated silyl amide.

Further embodiments of the disclosure are directed to methods of depositing a film comprising Si, C, O and N, the method comprising: exposing a substrate surface to a silicon precursor to form a film with silicon-halogen terminations, wherein the silicon precursor comprises a halogenated silyl amide, the silicon precursor comprises a compound having the general formula XnSi(NRR')(4-n), where n is 1-3, each X is independently Br or I, each of R and R' is an alkyl or aryl having in the range of 1 to 8 carbon atoms; and exposing the film with silicon-halogen terminations to an alcohol-amine to form a film comprising —OH terminations, the alcohol-amine has a general formula H2N—R"—OH, where R" is an alkyl, alkenyl or alkynyl group having in the range of 1 to 8 carbons atoms.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
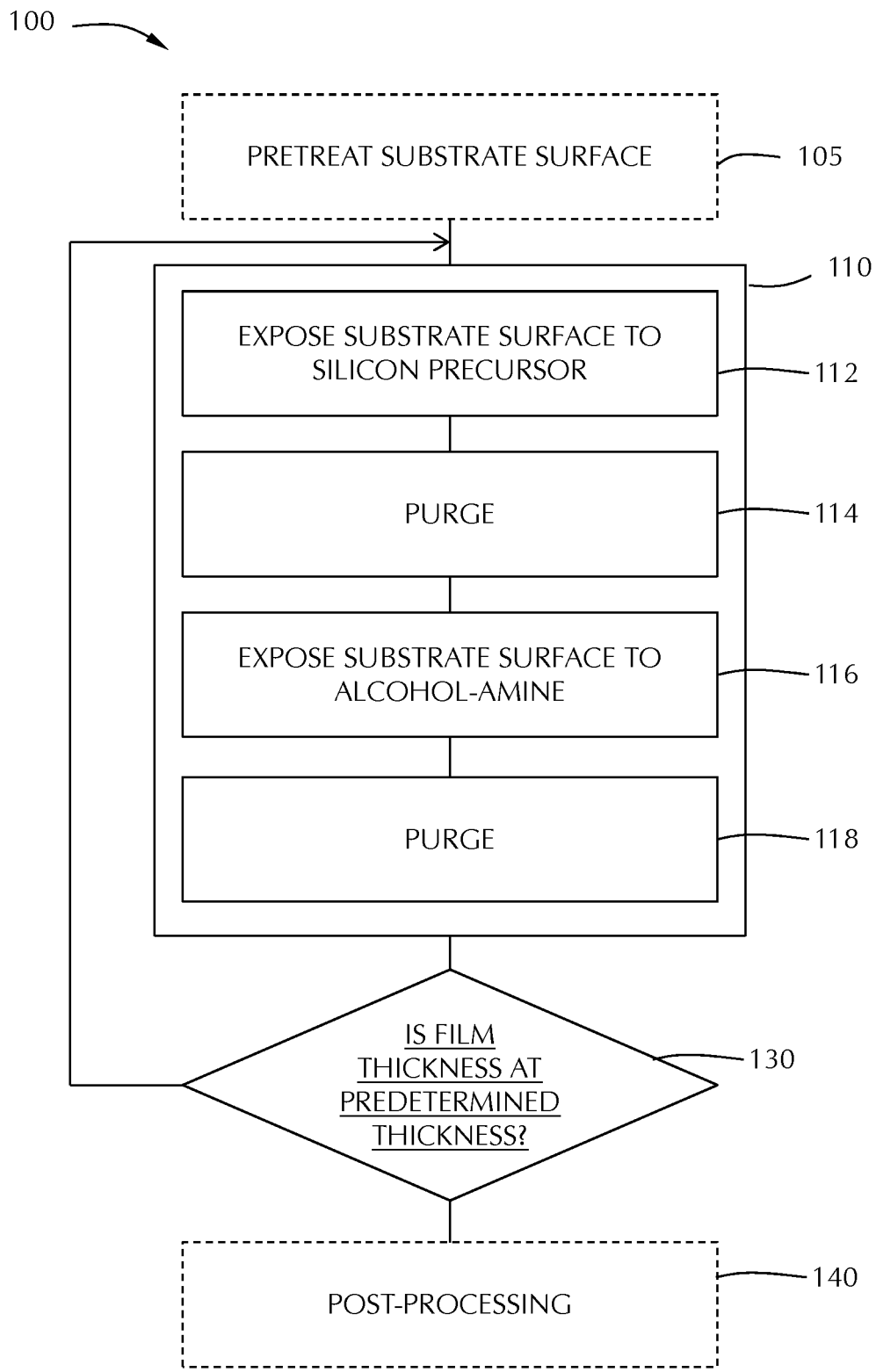
FIG. 1 shows a flowchart of a processing method according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Silyl halide precursors can react with R—$NH_2$ (or ammonia) groups to yield a SiCN film. However, the k value for SiCN is on the higher side (~6) and incorporation of O is used to bring the k value close to ~3.5-4. Using an alcohol amine introduces C, O and N in film but the ALD cycles doesn't propagate well as incoming silyl halide doesn't undergo a favorable reaction with Si—C—OH tail group. If silyl amides are used instead of silyl halide, the reaction is favorable only towards —OH terminated surfaces but doesn't react with —$NH_2$ termination. Typically oxidizing plasma is required for such ALD reactions, which deplete carbon from the film leading to SiO deposition. If alcohol amines are used for ALD cycles the reaction doesn't proceed after one complete cycle as C—$NH_2$ group does not react thermally with silyl amide precursors in vapor phase.

One of the major challenges of depositing ALD low materials is lower reactivity of silyl amides based precursors towards Si—C—O surface as incorporation of C reduces the number of Si—OH surface available for reacting with incoming precursor. The inventors have found that using a halogenated silyl amide (e.g., bis(dimethylamino)diiodosilane) and alcohol amine (e.g., ethanolamine) can lead to propagation of the reaction in both half cycles leading to a SiCO(N) film. Film composition can be tuned by using different bifunctional groups such as alcohols, amines or combination of both for depositing a SiCO, SiCN or SiCON films. Film quality can be also tuned by incorporating plasma treatment ($H_2$, CO, He, Ar, $N_2$ or a combination of these gases) to achieve better WER or ashing resistance.

Halogenated silyl amides can be used as nucleation enhancer for SiN growth processes. Silicon nitride is typically grown in thermal ALD mode using silyl halides ($SiCl_4$, $SiBr_4$, $SiI_4$, etc.) and $NH_3$ as co-reagent. One of the major challenges associated with thermal ALD of SiN is the nucleation at the surface. Surfaces of Si (or any other substrate) substrate is passivated with native oxide on air exposure having a Si—OH dangling bonds. Silyl halides do not react spontaneously with these —OH surfaces in vapor phase leading to a nucleation delay in SiN deposition. Silyl-amide bonds are very reactive towards Si—OH (or any oxide surface) surfaces. Therefore, the inventors have found that the nucleation delay issue can be mitigated using a halogenated silyl halide as pretreatment step before depositing the film.

Accordingly, one or more embodiments of the disclosure provide thermal ALD and plasma-enhanced ALD (PEALD) methods of forming SiCO, SiCN and SiCON films using halogenated silyl amide (e.g., bis(dimethylamino)diiodosilane) and an alcohol amine (e.g., ethanolamine). Some embodiments provide methods of forming SiCO and SiCON using a halogenated silyl amide followed by alternating exposures of a diamine or diol.

Some embodiments of the disclosure deposit silicon oxycarbide (SiCO) films. Some embodiment of the disclosure deposit silicon carbonitride (SiCN) films. Some embodiments of the disclosure deposit silicon oxycarbonitride (SiCON) films. Some embodiments of the disclosure provide methods of depositing SiCO(N) films. As used in this disclosure and the appended claims, the term "SiCO(N)" refers to a film comprising silicon (Si) and carbon (C) and, optionally, one or more of oxygen (O) or nitrogen (N) atoms. For example, the term "SiCO(N)" refers to SiCO, SiCN and SiCON films.

Some embodiments of the disclosure advantageously provide methods of depositing films with relatively high carbon content. As used in this specification and the appended claims, the term "high carbon content" means a carbon content greater than or equal to about 10 atomic percent. Some embodiments advantageously provide methods of forming SiCO, SiCN or SiCON films with a dielectric constant (k) less than or equal to about 4.5.

Figure 2:
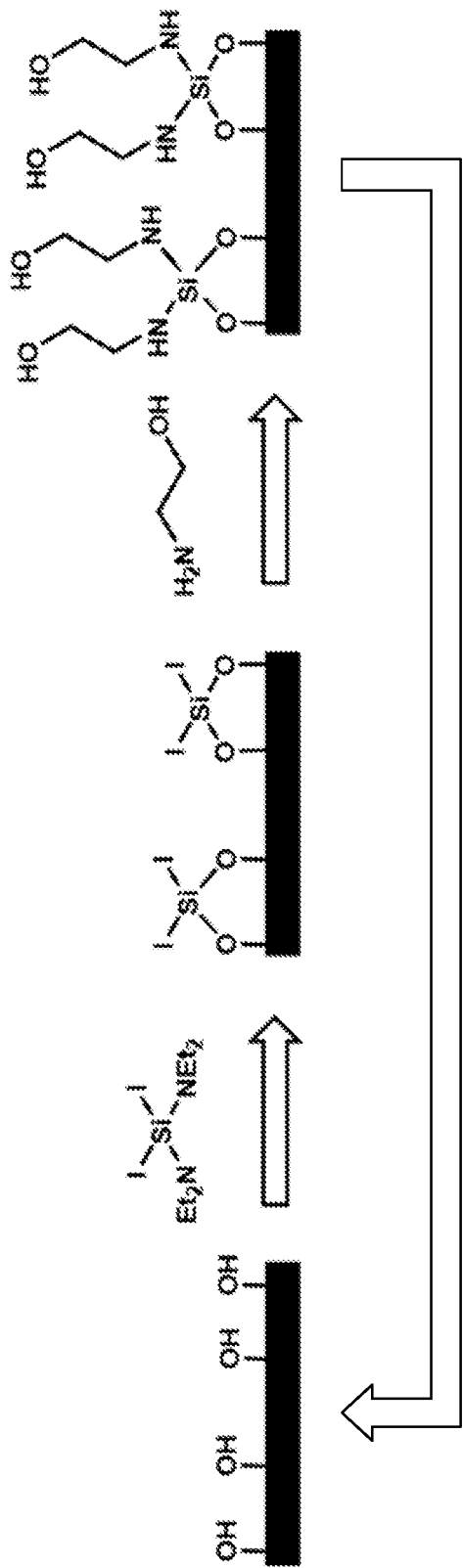
FIG. 2 shows a schematic representation of a method according to one or more embodiment of the disclosure.

With reference to FIGS. 1 and 2, one or more embodiments of the disclosure are directed to methods 100 of depositing a thin film comprising silicon (Si) and one or more of carbon (C), oxygen (O) and nitrogen (N). FIG. 1 illustrates an exemplary flowchart of the method 100 and FIG. 2 illustrates an exemplary method according to one or more embodiment.

Process 110 in FIG. 1 comprises several individual operations, as described herein. The process 110 can occur in seamlessly in a single processing chamber, or can occur in multiple processing environments (e.g., in a spatially-separated ALD chamber). Beginning with process 110 in FIG. 1, a hydroxyl (—OH) terminated substrate surface is exposed to a silicon precursor in a suitable processing chamber, as shown in operation 112. The reaction of the hydroxyl-terminated substrate surface with the silicon precursor forms a film with a silicon-halogen terminated surface.

In operation 114, the process chamber or substrate surface is purged of unreacted silicon precursor. In a time-domain ALD process, the process chamber is purged of silicon precursor and any reaction products or byproducts. In a spatial ALD process, the substrate surface is purged of silicon precursor and any reaction products or byproducts by passing the substrate from one processing environment to a second processing environment within the processing chamber. In a spatial ALD process, the substrate surface is typically purged by passing the substrate through a gas curtain comprising one or more of inert gas streams (flowing into the chamber) and vacuum streams (flowing out of the chamber).

In operation 116, the substrate surface is exposed to an alcohol-amine reactant to form a film comprising —OH terminations. After a reaction of the alcohol-amine reactant with the surface silicon-halogen terminated surface, in operation 118, the process chamber or substrate surface is purged of unreacted alcohol-amine, reaction products and byproducts.

FIG. 2 shows an exemplary process according to method 100. The reactive species illustrated in FIG. 2 are merely one possible configuration of the method 100 and should not be taken as limiting the scope of the disclosure. As illustrated in FIG. 2, the substrate surface, initially having hydroxyl-terminations, is exposed to bis(dimethylamino)diiodosilane to form a silicon-iodide terminated surface. After purging, the silicon-iodide terminated surface is exposed to ethanolamine to form a thin film with hydroxyl-terminations.

Referring back to FIG. 1, the method 100 reaches decision point 130. If the thickness of the thin film has reached a predetermined value, the method 100 can be stopped, or can move to an optional post-process. If the thickness has not reached the predetermined value, the method 100 repeats process 110 to deposit another layer. The process 110 forms a hydroxyl-terminated surface so that the process 110 can be repeated without further surface modifications.

Figure 3:
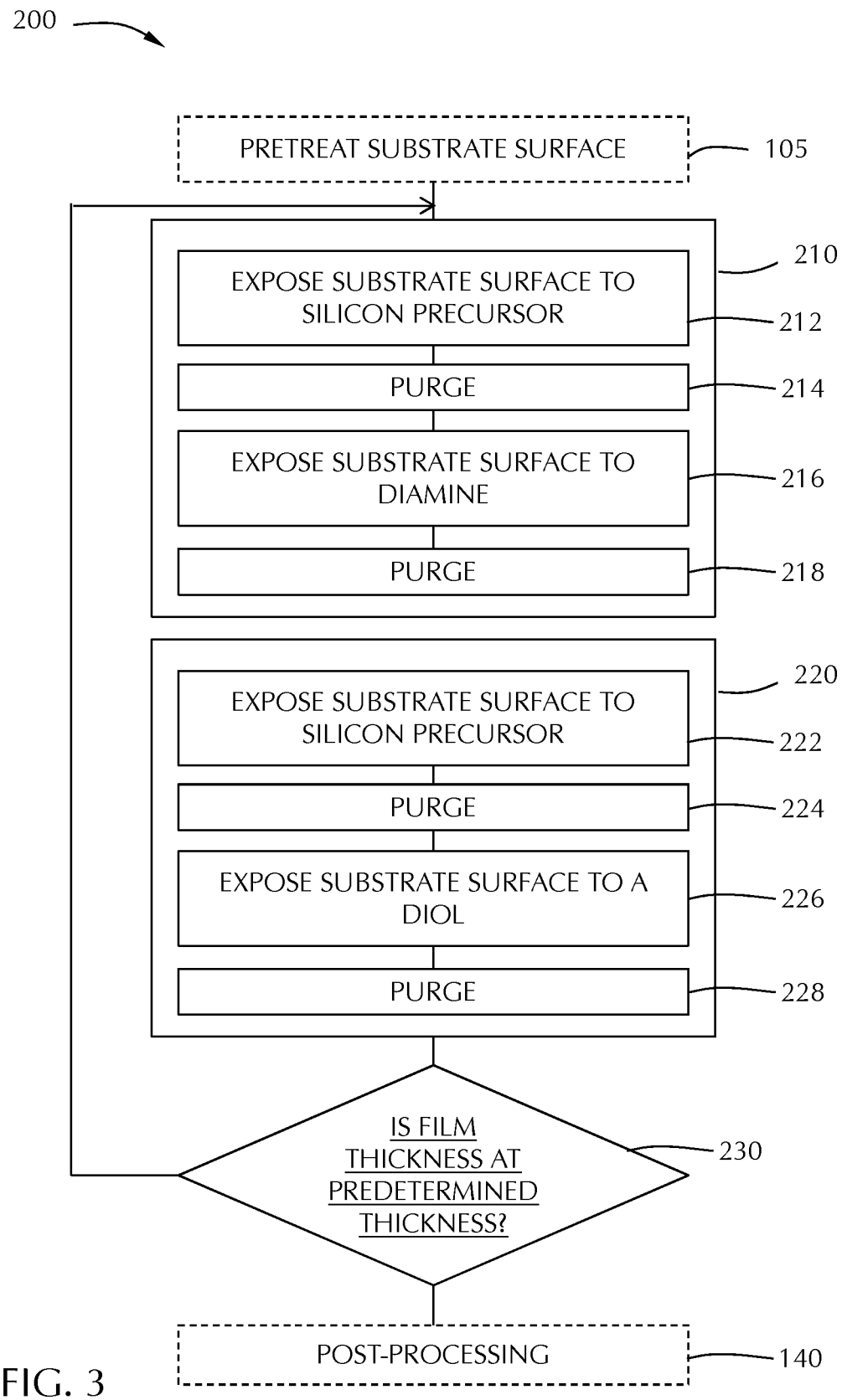
FIG. 3 shows a flowchart of a processing method according to one or more embodiment of the disclosure.
Figure 4:
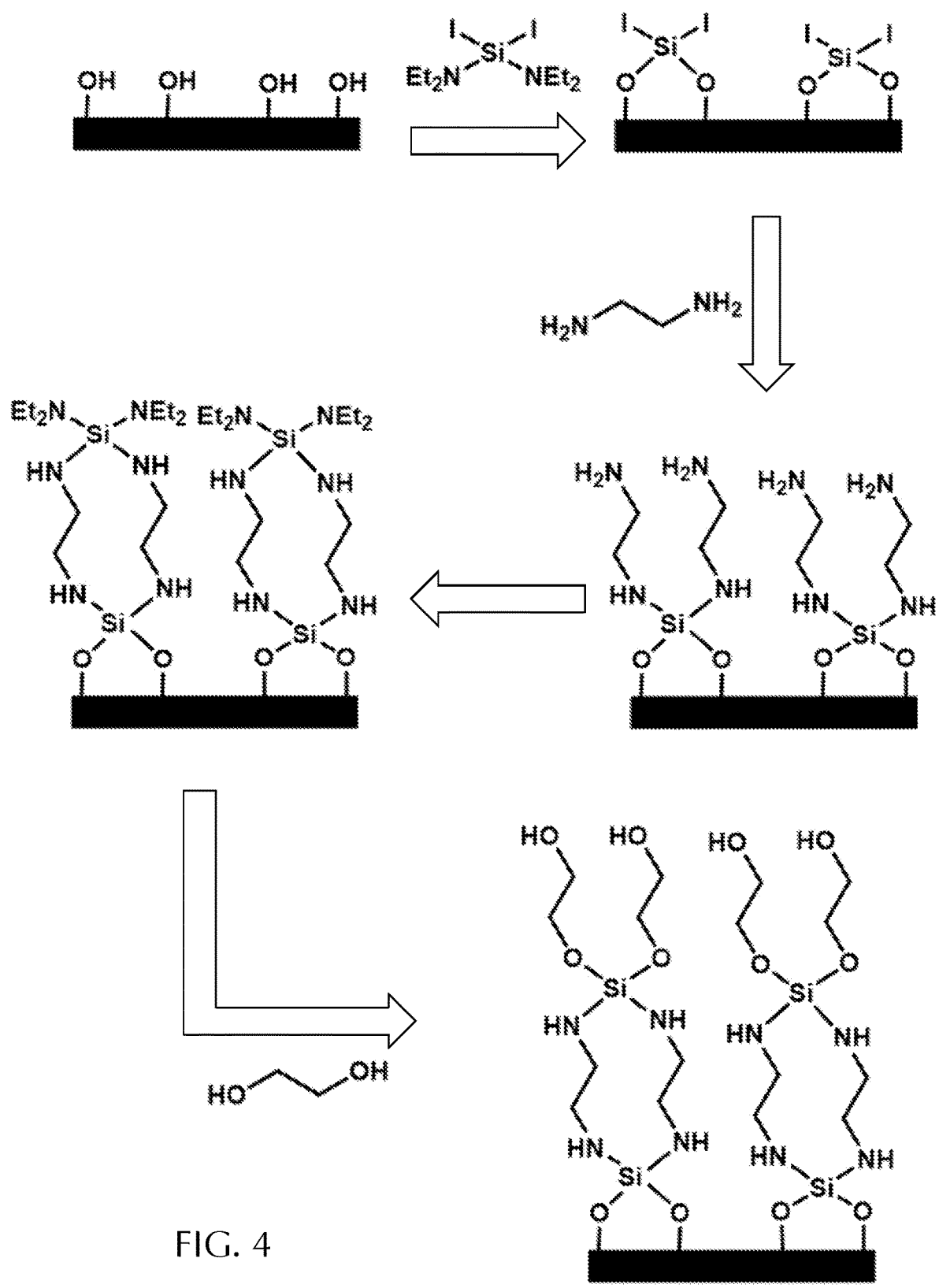
FIG. 4 shows a schematic representation of a method according to one or more embodiment of the disclosure.

FIGS. 3 and 4 illustrate a method 200 according to one or more embodiments of the disclosure. Similar to method 100, method 200 can deposit a thin film comprising silicon (Si) and one or more of carbon (C), oxygen (O) and nitrogen (N). The embodiment of FIGS. 3 and 4 use two process conditions, as shown in process 210 and process 220. As used in this manner, the term "process condition" means conditions used for particular reaction. For example, a combination of reactive species, inert gases, temperature, pressure, etc., known to the skilled artisan.

Process 210 in FIG. 3 comprises several individual operations, as described herein. The process 210 can occur in seamlessly in a single processing chamber, or can occur in multiple processing environments (e.g., in a spatially-separated ALD chamber). Beginning with process 210 in FIG. 3, a hydroxyl (—OH) terminated substrate surface is exposed to a first silicon precursor in a suitable processing chamber, as shown in operation 112. The reaction of the hydroxyl-terminated substrate surface with the silicon precursor forms a film with a silicon-halogen terminated surface.

In operation 214, the process chamber or substrate surface is purged of unreacted silicon precursor. In a time-domain ALD process, the process chamber is purged of silicon precursor and any reaction products or byproducts. In a spatial ALD process, the substrate surface is purged of silicon precursor and any reaction products or byproducts by passing the substrate from one processing environment to a second processing environment within the processing chamber. In a spatial ALD process, the substrate surface is typically purged by passing the substrate through a gas curtain comprising one or more of inert gas streams (flowing into the chamber) and vacuum streams (flowing out of the chamber).

In operation 216, the substrate surface is exposed to a diamine reactant to form a film comprising —NH$_2$ terminations or amine-terminations. After a reaction of the diamine reactant with the surface silicon-halogen terminated surface, in operation 218, the process chamber or substrate surface is purged of unreacted diamine, reaction products and byproducts.

Process 220 in FIG. 3 comprises several individual operations, as described herein. The process 220 can occur in seamlessly in a single processing chamber, or can occur in multiple processing environments (e.g., in a spatially-separated ALD chamber). Beginning with process 220 in FIG. 3, an amine-terminated substrate surface is exposed to a second silicon precursor in a suitable processing chamber, as shown in operation 222. The reaction of the amine-terminated substrate surface with the silicon precursor forms a film with a silicon-halogen terminated surface.

In operation 224, the process chamber or substrate surface is purged of unreacted silicon precursor. In operation 226, the substrate surface is exposed to a diol reactant to form a film comprising —OH terminations. After a reaction of the diol reactant with the surface silicon-halogen terminated surface, in operation 228, the process chamber or substrate surface is purged of unreacted diamine, reaction products and byproducts.

The combination of process 210 and process 220 reforms the hydroxyl-terminated surface. The skilled artisan will recognize that process 220 can be performed before process 210. The flowchart illustrated in FIG. 3 should not be taken as limiting the order of reactions.

FIG. 4 shows an exemplary process according to method 200. The reactive species illustrated in FIG. 4 are merely one possible configuration of the method 200 and should not be taken as limiting the scope of the disclosure. As illustrated in FIG. 4, the substrate surface, initially having hydroxyl-terminations, is exposed to a first silicon precursor (shown as bis(dimethylamino)diiodosilane) to form a silicon-iodide terminated surface. After purging, the silicon-iodide terminated surface is exposed to ethylene diamine to form a thin film with amine-terminations. The amine-terminated film is then exposed to a second silicon precursor (which can be the same as the first silicon precursor or a different silicon precursor) to form silicon-iodide terminated surface. After purging, the silicon-iodide terminated surface is exposed to 1,2-dihydroxyethane to form a thin film with hydroxyl-terminations.

Referring back to FIG. 3, the method 200, similar to method 100, reaches decision point 230. If the thickness of the thin film has reached a predetermined value, the method 200 can be stopped, or can move to an optional post-process. If the thickness has not reached the predetermined value, the method 200 repeats process 210 and/or 220 to deposit another layer.

The silicon precursor can be any suitable silicon species. In some embodiments, the silicon precursor comprises substantially no Si—C bonds. As used in this manner, the term "substantially no Si—C bonds" means that the reactive silicon species has less than or equal to about 5%, 2%, 1% or 0.5% Si—C bonds, on a molecular basis.

In some embodiments, the silicon precursor of method 100, or first silicon precursor and/or second silicon precursor of method 200, comprises or consists essentially of a species with the general formula $X_nSi(NRR')_{(4-n)}$, where n is 1-3, each X is independently F, Cl, Br or I, each of R and R' is independently an alkyl or aryl having in the range of 1 to 8 carbon atoms. In some embodiments, each X is independently selected from bromine (Br) or iodine (I). In some embodiments, substantially all X atoms are Br. In some embodiments, substantially all X atoms are I. As used in this manner, the term "substantially all" means that the halogen atoms of the reactive species are greater than or equal to about 95%, 98%, 99% or 99.5% of the stated species. In some embodiments, the silicon precursor of any of method 100 or method 200 comprises or consists essentially of a species with two halogen and two amino groups ($X_2Si(NRR')_2$). In some embodiments, the silicon precursor comprises or consists essentially of a bis(organoamino)diiodosilane ($I_2Si(NRR')_2$). In some embodiments, the silicon precursor comprises or consists essentially of bis(dimethylamino)diiodosilane ($I_2Si(N(CH_3)_2)_2$).

The alcohol-amine can be any suitable reactive species. In some embodiments, the alcohol-amine has a general formula $H_2N$—R"—OH, where R" is an alkyl, alkyenyl or alkynyl group having in the range of 1 to 16 carbons atoms. In some embodiments, the R" has in the range of 2 to 8 carbon atoms. In some embodiments, the R" has in the range of 2 to 4 carbon atoms.

In embodiments similar to method 200, the diamine and diol can be any suitable diamine or diols. In some embodiments, the diamine has a general formula $H_2N$—$R^3$—$NH_2$, where $R^3$ is an alkyl, alkyenyl or alkynyl group having in the range of 1 to 16 carbons atoms. In some embodiments, $R^3$ has in the range of 2 to 8 carbon atoms. In some embodiments, $R^3$ has in the range of 2 to 4 carbon atoms.

In some embodiments, the diol has a general formula HO—$R^4$—OH, where $R^4$ is an alkyl, alkenyl or alkynyl group having in the range of 1 to 16 carbon atoms. In some embodiments, $R^4$ has in the range of 2 to 8 carbon atoms. In some embodiments, $R^4$ has in the range of 2 to 4 carbon atoms.

Figure 5:
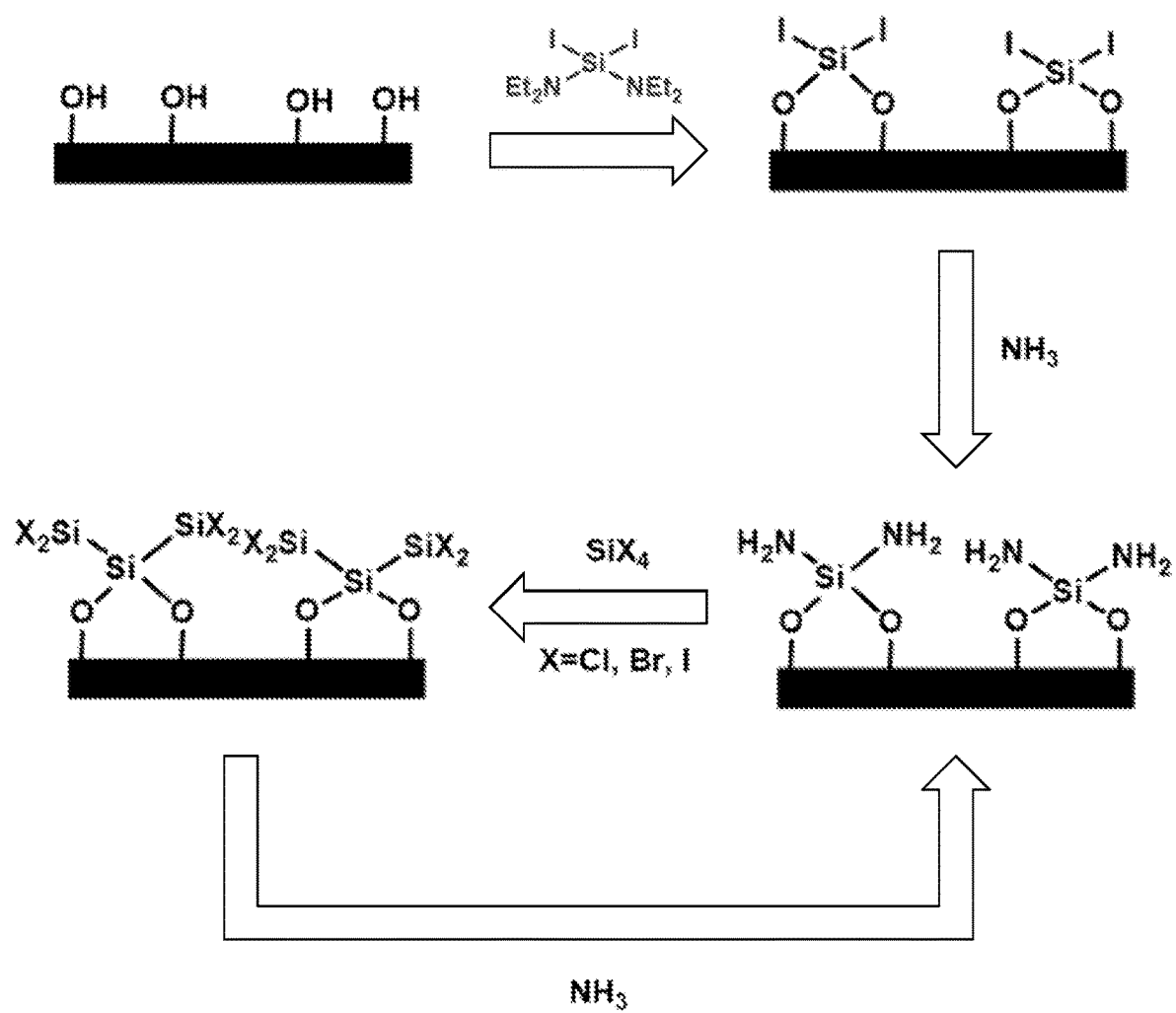
FIG. 5 shows a schematic representation of a method according to one or more embodiment of the disclosure.

FIG. 5 shows another embodiment of the disclosure in which nucleation delay of a hydroxyl-terminated substrate surface is resolved or mitigated using a halogenated silyl-amide as a pretreatment before performing a silicon nitride deposition process. The silyl-amide bonds are reactive toward the Si—OH terminations (or other oxide surfaces). In some embodiments, the nucleation delay issue is resolved by one or more exposures of the hydroxyl-terminated substrate surface to a halogenated silylamide to form a silicon-halogen terminated surface. After forming the silicon-halogen terminated surface, the silicon nitride film is deposited by sequential and repeated exposures (i.e., atomic layer deposition) or simultaneous exposure (i.e., chemical vapor deposition) to a nitrogen reactant (e.g., ammonia) and a silicon halide. In some embodiments, the silicon halide comprises $SiX_4$, where each X is independently selected from Cl, Br or I.

In some embodiments, a silicon carbonitride or silicon oxycarbonitride film is formed. In some embodiments, the silicon precursor comprises carbon atoms in the organic amine groups. In some embodiments, the silicon precursor does not contain carbon. In embodiments where the silicon precursor does not contain carbon, some other carbon source may be provided. For example, if a plasma is used, the plasma may be a carbon source. In some embodiments, a plasma may be dual function (e.g., be a densification plasma as well as providing a carbon source for the film). In alternative embodiments, the silicon precursor does contain carbon. In such embodiments, other components used in making the film (i.e., other precursor or film) may or may not also contain carbon. Using other precursors or films that also contain carbon may help in increasing the overall carbon content of the film.

In some embodiments, the silicon precursor is silane-based, such as halogenated silane ($SiH_4$), disilane ($Si_2H_6$), trisilane ($Si_3H_8$), etc. The silane-based silicon precursors may features one or more, and up to all, of the hydrogen atoms replaced with halogen atoms. Examples of suitable precursors therefore comprise monochlorosilane, dichlorosilane, trichlorosilane, or silicon tetrachloride, hexachlorodisilane (HCDS).

In one or more embodiments, the silicon precursor comprises a halogenated carbosilane. Suitable halogenated carbosilanes include, but are not limited to, those based on 1,4-disilabutane, 1,3-disilabutane, 1,3,5-trisilapentane, 1,3-disilacyclobutane and 1,3,5-trisilacyclohexane, etc.

In one or more embodiments, the method comprises exposing the substrate surface to a nitrogen-containing plasma. In some embodiments, the nitrogen-containing plasma comprises ammonia, an amine, hydrazine or carbonitride. As discussed above, the nitrogen-containing plasma may or may not contain carbon depending on the silicon precursor used, and depending on whether there are other sources of carbon. In embodiments where the silicon precursor does not contain carbon, then the nitrogen-containing plasma may have carbon, so that there is at least one source of carbon for the SiCN film. Examples of plasmas that contain nitrogen and carbon include plasmas comprising alkyl amines, such as methyl amine, ethyl amine, dimethyl amine, diethyl amine, trimethyl amine, triethyl amine, methyl ethyl amine, dimethyl ethyl amine, tert-butyl amine, etc. Where a silicon precursor is used that does contain carbon, then the nitrogen-containing plasma does not need to also contain carbon, although it may also contain carbon to increase the carbon content of the resulting film.

In one or more embodiments, the nitrogen-containing plasma is a mixture of compounds. Thus, for example, the nitrogen-containing plasma may comprise $N_2$, as well as other components. Other components include, but are not limited to ammonia, amines, and carbon-containing components.

In some embodiments, the nitrogen-containing plasma also contains a diluting component. For example, the nitrogen-containing plasma may be diluted with argon, helium or other inert dilution plasma. In one or more embodiments, the exposure of the substrate surface to a halogenated silicon precursor and nitrogen-containing plasma occurs in one chamber.

In some embodiments, the method comprises exposing the substrate surface to a nitrogen precursor to provide a film. In further embodiments, the nitrogen precursor comprises ammonia, alkyl amine or other amine. In some embodiments, ammonia is utilized for thermal reactions, and nitrogen or nitrogen with ammonia for plasma-based reactions. As discussed above, the nitrogen precursor may or may not contain carbon depending on the silicon precursor used, and whether there are other sources of carbon. In embodiments, where the silicon precursor does not contain carbon, then the nitrogen precursor may have carbon, so that there is at least one source of carbon for the SiCN film. Where a silicon precursor is used that does contain carbon, then the nitrogen precursor does not need to also contain carbon, although it may also contain carbon to increase the carbon content of the resulting film.

In one or more embodiments, the silicon precursor comprises a halogenated silane and the nitrogen precursor comprises ammonia. In some embodiments, the silicon precursor comprises a halogenated carbosilane and the nitrogen precursor comprises an alkyl amine.

In one or more embodiments, the method comprises exposing the film comprising Si and N to a densification plasma. Densification plasmas allow for removal of hydrogen. Any densification plasmas known in the art may be utilized, including, but not limited to, hydrogen gas ($H_2$), nitrogen gas ($N_2$), etc.

In some embodiments, the exposure of the substrate surface to a halogenated silicon precursor, nitrogen precursor and densification plasma occurs in one chamber.

In one or more embodiments, the method further comprises exposing the film comprising Si and N to a carbon source. In some embodiments, the carbon source comprises exposing the film comprising Si and N to a compound with a C=C bond. An exemplary carbon source is propylene. When plasma is used for the reaction, other carbon sources can be used as well: methane, acetylene.

The specific reaction conditions for the ALD reaction will be selected based on the properties of the film precursors, plasmas, any other reagents and substrate surface. The deposition may be carried out at atmospheric pressure, but may also be carried out at reduced pressure. The vapor pressure of the catalyst should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure. The properties of the specific substrates, precursors, plasmas, and any other reagents may be evaluated using methods known in the art, allowing selection of appropriate temperature and pressure for the reaction. In any event, in one or more embodiments, the deposition is carried out at a temperature less than about 550° C., 500° C., 450° C., 400° C., 350° C., 300° C., 250° C. or 200° C.

In some embodiments, the substrate surface that will be exposed to various precursors contains a layer that allows the reaction of either the first or second precursors. Examples include layers that contain reactive —OH or —NH moieties or handles.

One or more of the methods described above may be an atomic layer deposition (ALD) process. In such embodiments, the substrate surface is exposed to the precursors sequentially or substantially sequentially. As used herein throughout the specification, "substantially sequentially" means that a majority of the duration of a precursor exposure does not overlap with the exposure to a co-reagent, although there may be some overlap.

One or more of the methods described above may be a chemical vapor deposition (CVD) process. In such embodiments, the substrate surface is exposed to the precursors simultaneously or substantially simultaneously. As used herein throughout the specification, "substantially simultaneously" means that the majority of the duration of a precursor exposure overlaps with the exposure to a co-reagent, although they may not be exactly co-extensive.

In one or more embodiments, once a process has been carried out, it may be repeated to achieve additional layers of film deposition. The process may be repeated as necessary to achieve predetermined film thicknesses. Additionally, certain parts of the methods described herein may be repeated. For example, in some embodiments relating to a thermal ALD of SiN process followed by densification plasma, the thermal ALD process may be repeated several times prior to exposure to the densification plasma.

In one or more embodiments, the methods described above may be combined with other film deposition processes. That is, in some embodiments, the above methods may be used to deposit SiCN over or under other films to achieve an overall composition. For example, SiCN deposition may be combined with alternating layers of SiN, SiC, and SiCN deposition by methods known in the art. In some embodiments, a low-k dielectric, thermally stable film (containing —CN or —C—CN) and having good electrical properties (—SiN bonds) and good HF-solution etch resistance can be achieved by adding carbon to a SiN monolayer. Examples of this approach would utilize HCDS or DCS as ALD silicon precursors, and reacting with $NH_3/N_2$ and a hydrocarbon (e.g., $CH_4$ or $C_2H_2$). In embodiments where the chosen film is for application as a laminated spacer material, the method may further comprise an ex-situ plasma treatment to satisfy integration requirements.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber(s). Thus, the flow of inert gas forms a curtain at the exit of the chamber.

The substrate can be processed in single substrate deposition chambers, where a single substrate is loaded, processed and unloaded before another substrate is processed.

The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be required to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film comprising Si, C, O and N, the method comprising:

exposing a substrate surface to a silicon precursor to form a film with silicon-halogen terminations, wherein the silicon precursor comprises a halogenated silyl amide, the silicon precursor comprises a compound having the general formula $X_n Si(NRR')_{(4-n)}$, where n is 1-3, each X is independently F, Cl, Br or I, each of R and R' is an alkyl having in the range of 5 to 8 carbon atoms or an aryl having in the range of 1 to 8 carbon atoms; and exposing the film with silicon-halogen terminations to an alcohol-amine to form a film comprising —OH terminations.

2. The method of claim 1, wherein the silicon precursor comprises substantially no Si—C bonds.

3. The method of claim 1, wherein each X is selected from Br or I.

4. The method of claim 1, wherein the alcohol-amine has a general formula $H_2N$—R"—OH, where R" is an alkyl, alkyenyl or alkynyl group having in the range of 1 to 16 carbons atoms.

5. The method of claim 4, wherein R" has in the range of 2 to 8 carbon atoms.

6. The method of claim 5, wherein R" has in the range of 2 to 4 carbon atoms.

7. The method of claim 5, wherein R" has in the range of 4 to 8 carbon atoms.

8. The method of claim 1, further comprising repeating exposures to the silicon precursor and alcohol-amine to form a film having a predetermined thickness.

9. A method of depositing a film comprising Si, C, O and N, the method comprising:

exposing a substrate surface to a silicon precursor to form a film with silicon-halogen terminations, wherein the silicon precursor comprises a halogenated silyl amide, the silicon precursor comprises a compound having the general formula $X_n Si(NRR')_{(4-n)}$, where n is 1-3, each X is independently Br or I, each of R and R' is an alkyl having in the range of 5 to 8 carbon atoms or an aryl having in the range of 1 to 8 carbon atoms; and exposing the film with silicon-halogen terminations to an alcohol-amine to form a film comprising —OH terminations, the alcohol-amine has a general formula $H_2N$—R"—OH, where R" is an alkyl, alkenyl or alkynyl group having in the range of 1 to 8 carbons atoms.

10. The method of claim 9, further comprising repeating exposures to the silicon precursor and alcohol-amine to form a film having a predetermined thickness.

* * * * *